(12) United States Patent
Bleakley (10) Patent No.: US 7,209,852 B2
(45) Date of Patent: Apr. 24, 2007

(54) CIRCUIT FOR PRODUCING A VARIABLE FREQUENCY CLOCK SIGNAL HAVING A HIGH FREQUENCY LOW JITTER PULSE COMPONENT

(75) Inventor: Thomas E. Bleakley, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 1037 days.

(21) Appl. No.: 09/823,947

(22) Filed: Mar. 30, 2001

(65) Prior Publication Data

US 2002/0144168 A1   Oct. 3, 2002

(51) Int. Cl.
G06F 19/00 (2006.01)
(52) U.S. Cl. .............. 702/125; 702/117; 702/120; 702/125; 716/4; 714/724; 714/726; 714/731; 340/870.24; 340/870.13; 340/870.19; 327/114; 327/117; 369/47.15; 369/59.1
(58) Field of Classification Search .............. 702/117, 702/120, 114, 125; 714/724, 726; 716/4; 340/870.24, 870.13, 870.19; 327/114, 117; 369/47.15, 59.1–59.2
See application file for complete search history.

(56) References Cited

U.S. PATENT DOCUMENTS

| | | | | |
|---|---|---|---|---|
| 3,872,455 A | * | 3/1975 | Fuller et al. | ............ 340/870.05 |
| 5,052,019 A | * | 9/1991 | Ziegler | ........................ 375/239 |
| 5,142,169 A | * | 8/1992 | Huser | .......................... 327/28 |
| 5,604,452 A | | 2/1997 | Huang | |
| 6,081,913 A | | 6/2000 | Narayanan et al. | |
| 6,442,722 B1 | * | 8/2002 | Nadeau-Dostie et al. | ... 714/731 |
| 6,704,892 B1 | * | 3/2004 | Kurd et al. | ................. 714/724 |
| 2003/0021464 A1 | * | 1/2003 | Takeoka et al. | ............ 382/145 |

* cited by examiner

Primary Examiner—Edward Raymond
Assistant Examiner—Elias Desta
(74) Attorney, Agent, or Firm—Blakely, Sokoloff, Taylor & Zafman LLP (57) ABSTRACT

Embodiments of the present invention include first and second pulse trains input to a switch in synchronization. The first and second pulse trains may have a repeating high and low values at first and second frequencies, respectively, and the first pulse train may transition from the low to the high value with a first edge sharpness. The second pulse train input may have a lower than the first frequency. The switch may use a selection signal in synchronization with the first pulse train to select an output from the first or second pulse train to create an output pulse train appropriate to transition fault test an integrated circuit. The switch may switch from the second pulse train to the first pulse train and substantially maintain the first edge sharpness of the first pulse train during a low value of both the first and second pulse trains.

18 Claims, 4 Drawing Sheets

CIRCUIT FOR PRODUCING A VARIABLE FREQUENCY CLOCK SIGNAL HAVING A HIGH FREQUENCY LOW JITTER PULSE COMPONENT

BACKGROUND OF THE INVENTION

1. Field of the Invention

The present invention relates to a circuit for generating a pulse signal having a sequential low frequency portion and a high frequency portion having sharp pulse edges, particularly useful for input of a clock source input to a scan chain of a circuit under test for transition fault screening.

2. Background Information

In the production phase of integrated circuit development, transition fault testing is used to measure the time it takes for input data to propagate in the core of a circuit under test and to validate that time against defined propagation requirements. Even though circuit components may be connected adequately to propagate a signal at a slower speed and thus appear to operate correctly, they may propagate the signal too slowly at functional at-frequency clock speeds. In transition fault testing, the propagation delays between scan chains are stressed by reducing the time between a launch event and a capture event. Transition fault testing should exercise the circuit under test at functional at-frequency clock speeds in order for all flaws that will be present at such speeds to reveal themselves.

To properly test and measure the performance of a circuit undergoing transition fault testing, test input pulses must not only have the same data rate as functional clock speeds, but also must have a leading edge sharpness that will not impact the precise propagation of a test pulse, and its subsequent measurement. This is particularly important at the high data rates of present day integrated circuit computing devices, in which a pulse edge sharpness having a poor edge placement accuracy encompasses a functionally important portion of the entire pulse period. Recent advances in circuit design have provided integrated circuits that run at a clock speed that is great enough to make and require a pulse edge sharpness that traditional automatic test equipment do not generally provide. Speed failures in the core of these circuits under test should be run at the in-application functional clock speeds with in-application edge sharpness to properly test the circuits' propagation characteristics.

Contemporary integrated circuit testing configures a modification of at least some of the circuit under test sequential (or storage) elements to include a latch and a coupled switch, and the serial coupling of these sequential elements to form at least one shift register. Each serial coupling of the sequential elements is referred to as a scan chain. The test inputs from a test generator are scanned into the storage elements and the test results are scanned out of the storage elements through the scan chain elements. Each sequential element is additionally coupled to at least one combinational circuit element. Once a proper test input has been shifted into a scan element, it is switched to exercise the sequential-combinational circuit by transmitting the input pulse train to the circuit elements. The result is captured by the scan element, and when the scan element is switched into the scan chain shifting mode, transferred to a capturing circuit by the scan chain.

During a test of an integrated circuit, the pulse rate to load and unload a scan chain has to be slower than the transition fault pulse rate. This is because while a circuit is in normal operation, a relatively small number of transistors are operated at a time, but during a scan chain load and unload operation, a very large number of transistors are operated at a time, and if transition fault clocking speeds are used to load and unload the scan chain, the circuit will overheat and become damaged. The intra-scan chain propagation delays are not necessarily characterized to operate at functional speeds. In fact it would be quite difficult to arrange the circuitry and layout to optimize the propagation delays for both the functional and the scan pathways.

Thus, in order to transition fault test a circuit, the input waveform must switch from a low speed clock rate appropriate for scan chain loading and unloading, to suddenly and for just two or more pulses, a functional at-frequency clock rate which may be at least several hundred MHz and has a sharpened edge accuracy, and then back again to a slow clock rate.

The problem is that it is very difficult to generate a slow frequency pulse, switch for just a few pulses to a high frequency sharp edged pulse, and then back again to the slow pulse. What is needed is a circuit and method to utilize the conventional test equipment outputs that can only generate slow pulses sufficient in edge quality to load and unload a scan chain, and possibly somewhat faster pulses lacking the edge sharpness necessary to perform transition fault screening, to generate the waveform necessary for transition fault testing a scan chain, the waveform comprising slow frequency pulses and high frequency sharp edged pulses.

BRIEF DESCRIPTION OF DRAWINGS

The present invention will be described by way of exemplary embodiments, but not limitations, illustrated in the accompanying drawings. Identical numerals indicate the same elements throughout the figures.

The order of description should not be construed as to imply that these operations are necessarily order dependent.

DETAILED DESCRIPTION OF THE INVENTION

In the following description, various aspects and details of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without the specific aspects and details. In other instances, well known features are omitted or simplified, including apparatus and method steps, in order not to obscure the present invention.

Various operations will be described as multiple discrete steps performed in turn in a manner that is most helpful in understanding the present invention. However, the order of description should not be construed as to imply that these operations are necessarily order dependent, in particular, the order the steps are presented. Any necessary ordering is alternatively expressly mentioned or will be understood by those skilled in the art. Furthermore, the phrases "in one embodiment" and/or "an embodiment" are used repeatedly. However the phrases do not necessarily refer to the same embodiment, although they may.

Figure 1:
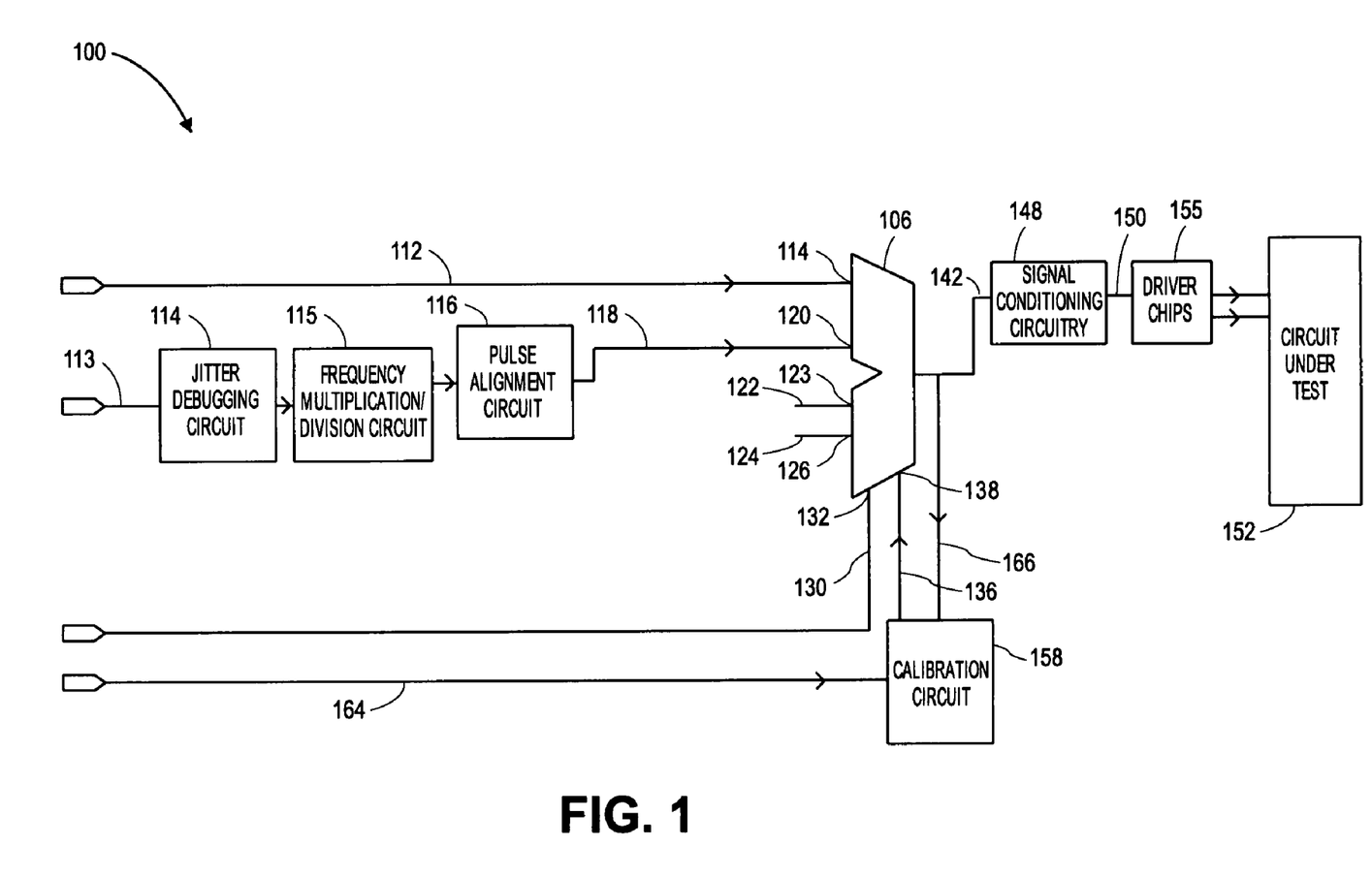
FIG. 1 portrays a circuit diagram of an embodiment of the system of the present invention.

Referring to FIG. 1, a system 100 comprises four signals, a signal 112, a signal 113, a signal 130, and a signal 164. These four signals 112, 113, 130, and 164 preferably each emanate from a common clock domain to maintain synchronicity between them as shall be disclosed presently. The signals are preferably generated by pin electronics cards (PECs) of contemporary automatic test equipment in order to utilize existing equipment that a user of this invention may already have available. Signals generated by a common PEC system should be based upon a common clock domain and should therefore also be consequently synchronous.

The signal 112 comprises a pulse train at a frequency appropriate for loading and unloading the scan chain(s) (not shown) of a circuit under test 152. The pulses of the signal 112 have a frequency and an edge placement accuracy able to be generated by contemporary PECs, of the order of 10–60 MHz frequency and +/−200 Pico seconds edge placement accuracy, producing a frequency and an edge sharpness adequate to load and unload a scan chain but inadequate to transition fault test a circuit under test that may require an at least 100 MHz frequency, and an edge sharpness in the range of at least +/−40 Pico seconds.

The signal 113 comprises a pulse train as well, having both a frequency that can be generated in steady state and an edge placement sharpness that can be generated, by contemporary PECs. The signal 113 is passed through a multiplication/division circuit 115 of the present invention to be disclosed presently to raise the frequency of the signal 113 to a rate of at least 100 MHz appropriate for the transition test of a circuit under test. The exact input frequency of the pulse train 113 will reflect a tradeoff with the design of the multiplication/division circuit 115 to provide the desired transition test frequency, well know to those skilled in the art. The pulses themselves of the signal 113 are passed through a jitter debugging circuit 114 of the present invention to be disclosed presently to produce a renamed signal 118 having an edge sharpness adequate to enable a transition fault testing using the signal 118 as an input to a circuit under test.

The signals 130 and 164 are preferably input as selection control signals (after signal 164 has been transformed by a calibration circuit of the present invention and renamed signal 136) to a multiplexer switch 106 that depends upon their values to select an output signal for a circuit under test from the input signals 112 and 118 as is disclosed presently. The signals 130 and 164 have an edge sharpness not necessarily commensurate with the edge placement accuracy of the signal 118, that can be generated by contemporary PCEs.

The system 100 comprises a multiplexer switch 106 that has input signals 112, 118, and 124. Input signal 112 is coupled to an input port 114 of the multiplexer switch 106. Input signal 118 is coupled to an input port 120 of the multiplexer switch 106. Input signal 124 is coupled to an input port 126 of the multiplexer switch 106. The input signals 112, 118, and 124 each have a characteristic that has already been described and will be further described presently with reference to FIG. 2.

The multiplexer switch 106 conventionally selects an output 142 at any instant from the input signals 112, 118, and 124, that depends upon the values of the input control (or selection) signals 130 and 136. As has already been described and will be further seen in reference to FIG. 2, the input signal 112 is a slow clock pulse and the input signal 118 is a fast clock pulse. The multiplexer switch 106 in the portrayed embodiment has a four-valued truth table to control the switching of the inputs. The multiplexer switch 106 has a control (or selection) input represented in the FIG. 1 as a two signal input 130 and 136, each control signal input having two possible values, a high value and a low value, thus providing four possible logic states to the truth table: a high signal 130-high signal 136 value, a high signal 130-low signal 136 value, a low signal 130-high signal 136 value, and a low signal 130-low signal 136 value. Control signal 130 is coupled to a selection signal port 132 of the multiplexer switch 106. Control signal 136 is coupled to a selection signal port 138 of the multiplexer switch 106. The control signals 130 and 136 each have a characteristic to be described presently with reference to FIG. 2.

The multiplexer output 142 is input to a signal conditioning circuit 148 to translate the multiplexer voltage level to a circuit under test 152 voltage level while substantially maintaining the input signal 142 pulse edge accuracy in its output signal 150. The output 150 of the signal conditioning circuit 148 in application forms a clocking input to an at least one scan chain (not shown) of the circuit under test 152 and in application is output to the scan chain. In the embodiment portrayed in FIG. 1, the multiplexer switch 106 is an MC100EL57 presently available from ON Semiconductor Corporation of Phoenix Ariz. It operates on emitter coupled logic (ECL), approximately −1 volts to −2 volts. The circuit under test illustratively operates on CMOS logic, 0 volts to 3.3 volts. Therefore the signal conditioning circuit 148 illustratively translates from ECL logic to CMOS logic, from −1 to −2 volts to 0 to 3.3 volts.

The system 100 further includes in an embodiment of the present invention two driver chips 155 to produce a differential pair to invert the pulse train 150 and make up for any skewed difference in the two data paths. An embodiment of the present invention includes an input to the multiplexer switch 106 of a static high valued signal 122 coupled to the multiplexer switch 106 at port 123 to provide a flexibility feature to the design of an output stuck high to enable the output of pulses switched on the high valued portion of an incoming pulse.

Figure 2:
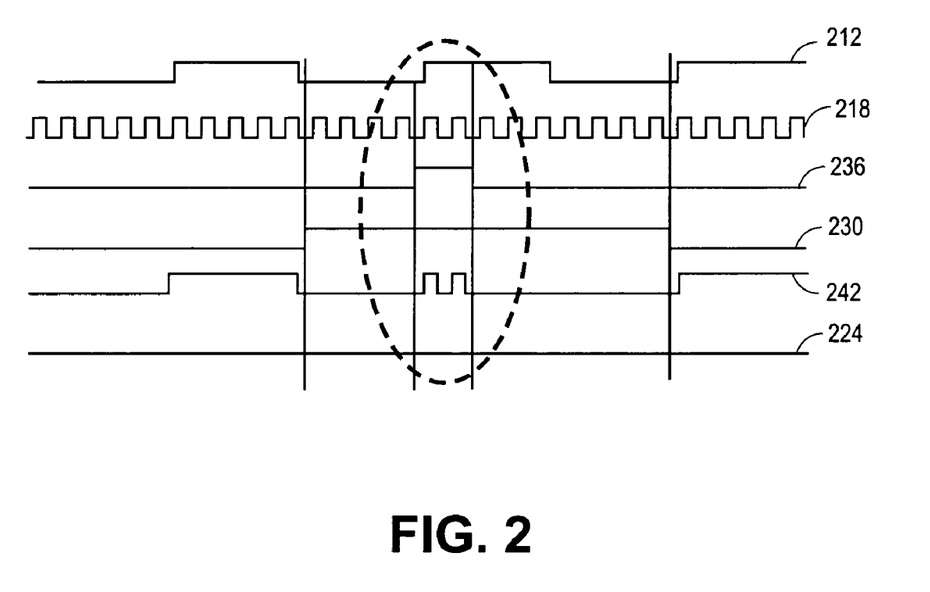
FIG. 2 portrays an illustrative timing and switching sequence chart of the multiplexer switch input, control, and output signals for the embodiment portrayed with reference to FIG. 1.

Referring now to both FIG. 1 and FIG. 2, the waveform of the switch output 142 is portrayed as the waveform 242. The signal 142 is selected from the waveform of alternatively the input signals 112, 118, or 124, depending upon the control signals 130 and 136. The waveform of the input signal 112 is portrayed as the waveform 212, the waveform of the input signal 118 is portrayed as the waveform 218, the waveform of the input signal 124 is portrayed as the waveform 224. The waveforms 212 and 218 are each preferably periodic pulse trains, and each is a periodic pulse train when selected as an output of the multiplexer switch 106 as described below. The frequency of the waveform 212 is a rate appropriate for a loading and for an unloading of a selected scan chain, well known to those skilled in the art. The frequency of the waveform 212 in an illustrative embodiment of the present invention is in the range 10–60 MHz. The frequency of the waveform 218 is a rate appropriate for a core transition fault testing of the circuit under test, also well known to those skilled in the art. The frequency of the waveform 218 is much higher that the frequency of the waveform 212. The frequency of the waveform 218 in an illustrative embodiment of the present invention is in the range of 100–500 MHz. Furthermore, the edge placement accuracy of the waveform 218 is a sharpness appropriate for the core transition fault testing of the circuit under test 152, also well know to those skilled in the art. It is within the specific contemplation of this invention that the frequency of the waveform 212 will increase in the future, subsequent to the filing date, as integrated circuits under test can withstand a greater scan chain load and unload clock speed. It is within the specific contemplation of this invention that the frequency of the waveform 218 will increase in the future, subsequent to the filing date, as the core speed of integrated circuits under test increases, and the transition fault testing frequency accordingly increases. The waveform of the input signal 124 is the waveform 224. The waveform 224 is preferably a static low value signal. It is low valued when it is selected as the output of the multiplexer switch 106 as described below.

The transition to/from the slow clock input signal 112 (having the less accurate edge placement) and the fast clock input signal 118 (having the more accurate edge placement) is not performed sequentially, but is performed by transitioning through the static low value of the input signal 124. In this manner, the less accurate edge placement of the control signals 130 and 136 (as well as the input signal 112) is negated because the multiplexer switch 106 output always switches at a time when the inputs and outputs of the multiplexer switch 106 are the low value state. Inaccuracies in the control signals 130 and 136 do not show up at the multiplexer switch 106 output 142 because the output 142 has switched from the low value state to the low value state.

The waveform of the control signal 130 is portrayed as the waveform 230. The waveform of the control signal 136 is portrayed as the waveform 236. It is seen that when the control signal waveform 230 and the control signal waveform 236 each have the low value, the multiplexer switch 106 selects the waveform 212 of the input signal 112 as the multiplexer output 242. In application, when the output 142 is the pulse(s) of the input signal 112, the output 142 drives an at least one scan chain to load or unload. Hence, though only a unitary signal 112 pulse is portrayed in FIG. 2 as being switched to the output 142, in application a plurality of sequential signal 112 pulses would be output from the multiplexer switch 106, and the control signals 130 and 136 will have low value waveforms during the duration of the signal 112 sequential pulses being selected as the switch 106 output.

It is seen that when the control signal waveform 236 has the low value, and the control signal waveform 230 has the high value, the multiplexer switch 106 selects the waveform 224 of the input signal 124 as the multiplexer output 242. The purpose of selecting the waveform 224 as the output of the multiplexer 106 is to put the selected multiplexer output into a low state for the succeeding selection of the input signal 118 as the multiplexer 106 output, to ensure that the subsequent outputting of the high frequency input signal waveform 218 as the multiplexer output signal 142 has the same edge placement accuracy as the input signal 118. In an embodiment, the selection signal 130 can be kept in a low state before the subsequent selection of the input signal 236 as the output signal 242 resulting in the selection of the input signal 112 for the output of the multiplexer 106 followed by the input signal 118 and the elimination of the need here for the static low input signal 124, if the input signal 112 is in the low state, and if the edge placement accuracy of the waveform 212 is such that it does not significantly alter the edge placement accuracy of the output waveform 242 from the edge placement accuracy of the waveform 218.

It is seen that when the control signal waveform 230 has the high value, and the control signal waveform 236 has the high value, the multiplexer switch 106 selects the waveform 218 of the input signal 118 as the multiplexer output 242. Although the duration of the high value for the control signals 130 and 136 is portrayed here as two waveform 218 pulses, in actual practice, this could be a pulse quantity other than two, such as three or four, to properly test a specific path of a circuit under test. Accordingly, the waveforms of the selection signal 130 and 136 will be specially designed for each circuit under test, and not necessarily be absolutely periodic (for a constant periodic two pulse output of the waveform 218). It is seen that the multiplexer switch 106 switches to the input signal 118 when the input signal 218 has a low value. The switching of the control signals 130 and 136 to the high value state is such that even though the control signals 230 and 236 may have an edge placement accuracy that is lower (that is, their edge has more jitter) than the input signal 118, they switch in enough time before the start of a high value input signal 118 pulse so that their relative edge inaccuracy does not affect the start of a switched to high value of the input signal 118. It is seen that when the control signal waveform 236 has the low value, and the control signal waveform 230 has the high value, the multiplexer switch 106 selects the waveform 224 of the input signal 124 as the multiplexer output 242, the input signal 124 being a static low value. The waveform 212 is switched to the output 242 before it goes to a high value.

Referring again to FIG. 1 only, The input signal 118 is generated from a signal 113. The signal 113 is passed through three circuits to condition its waveform to become the input signal 118 to the multiplexer switch 106. These signal conditioning circuits are a de-jittering or edge placement accuracy improvement circuit 114, a frequency multiplication/division circuit 115, and a pulse alignment circuit 116, that are each well known to those skilled in the art, and that can be alternatively implemented as separate circuitry or as shared circuitry, and implemented as well in any order along the signal path. The de-jittering circuit 114 and the frequency division/multiplication circuit 115 is preferably implemented through the common circuitry of a phased-lock loop. The phased-lock loop provides a high-frequency filtering to the incoming signal 113 preferably of the order of a 3 dB cutoff frequency equal to two times the desired input signal 118 frequency to filter out the high frequency components of the signal 113 that result in a jitter, the filtering resulting in pulses having an edge placement accuracy of at least preferably +/−40 Pico second peak cycle to cycle jitter. The phased-lock loop also provides a frequency changing to the incoming signal 113 that in the preferred embodiment, transforms an input pulse of the signal 113 from a frequency in the range 10–60 MHz to the input signal 118 having a frequency in the range 100–500 MHz. Because the phased-lock loop, or other dejittering and frequency multiplication circuit, delays an output signal, the signal 113 is passed through an alignment circuit to align the input signals 112 and 118 to establish a known relationship between their edges for a proper waveform generation in the multiplexer switch 106. Of course, the input signal 112 path in another embodiment of the present invention may alternatively include the alignment circuit instead of the input signal 118 path. It is preferred that the alignment circuit be contained in the signal 113-signal 118 path, and that it be implemented as a delay circuit, where because the waveform of the input signal 118 is a repeating pulse, it can be delayed far enough to re-establish the alignment between the input signals (by the pulse period less the imposed delay). The preferred embodiment to do this is a 629 programmable delay chip presently available from Semtech Corporation of Newbury Park Calif., wherein the delay circuit is disposed between the phase-locked loop and the multiplexer 106 so that its input is a low jitter high frequency clock.

The system 100 further includes a calibration circuit 158 coupled between a signal 164 and the selection control signal 136. Each of the signals 164, 130, 113, and 112 are preferably driven by a common clock domain so that each of the waveforms in the signals 112, 118, 130, and 136 are synchronous so that the waveforms of the signals 130 and 136 are precisely positioned to switch between the signals 112 and 118. Because the signal 118 is delayed by the de-jittering or edge placement accuracy improvement circuit 114, the frequency multiplication/division circuit 115, and the pulse alignment circuit 116, and in an embodiment the signal 112 is delayed by a pulse alignment circuit (not shown); the calibration circuit 158, along with the pulse alignment circuit 116, enable re-alignment of the signals 112, 118, 130, and 136. The signal 164 is input to the calibration circuit 158, and it's timing is transformed to the selection control signal 130. The calibration circuit 158 samples the multiplexer switch output signal 142 via line 166 to precisely establish the relationship between the select control signals 130 and 136, and the input signals 112, and 118. The calibration process has to, if necessary, be done only once after the circuitry of the system 100 has warmed up, and not each time the circuitry is used, such as each time when a circuit is tested.

Referring again to both FIGS. 1 and 2, there are a plural number of circuits and methods to realize the calibration of the signals 130 and 136. The timing relationship between the signals 112 and 118 is unknown and must be determined. Ideally, the edge transitions at the output 142 of the multiplexer switch 106 are aligned so that which of the input signal 112 and 118 selected is determinable. The ideal is limited by the edge placement accuracy of the control signals 130 and 130 (and thus the input signal 164), and by a limitation in the observability of the multiplexer switch 106 output 142.

There are a plural number of ways to determine the relationship at the multiplexer switch 106 output, well known to those skilled in the art. The tester resource can be a sole resource used. In an embodiment, the multiplexer switch 106 output 142 is sampled by using the output 142 as an input to a resettable latch (not shown). The tester's base calibration settings are customized for operation with the present invention, thereby optimizing the performance when focussed on this application. Operation in an embodiment is realized by first resetting the latch output to the low value. Second, a 10 MHz pulse train is created at the multiplexer switch input signal 112 while input signal 118 is kept at a constant low value. Third, the input signal 130 is predominantly kept at a low value, and is initially brought to a high value during the time when the input signal 112 is expected to be a low value. Finding the time period when input signal 112 has a low value is simple, because at 10 MHz there is a 50 Ns period of time when the input signal 112 has a low value. Fourth, if the control pin 132 goes high when both the selection control signals 130 and 136 have a low value, then the output 142 has a low value and stays low. The calibration input latch's clock does not get strobed, and the calibration latch's output remains at the reset LOW value state. This state (or value) of this latch is read by the controlling switch. If the latch output is LOW, then the programmed timing of the control signal is altered (advanced), and the reset latch's state is read. Fifth, this process is repeated until such time as the controlling switch detects that the calibration latch's output has transitioned to the high value. The latch is then reset, and the process is repeated but with the selection control signal 130 delayed rather than advanced. In this way, the location, in time, of the desired signal at the multiplexer switch 106 output has been determined.

There are a plural number of ways of the present invention to calibrate the High Speed path, as will be understood by the skilled in the art. In an embodiment, a way to program the high speed clock path to operate at the same slow speed as the slow path. Calibration then proceeds in a manner identical to how the slow speed clock path was calibrated. This method of calibration is acceptable subject to condition: that the propagation delay through the high speed path does not vary with the operating frequency. The degree of precision required of the high speed controlling multiplexer switch input selection control signal 136 is determined by the pulse width of the low value portion of the intended fast clock. The requirement is that the control signal occur near the center of the low pulse of the fast clock when it is operating at the desired frequency. For example, a 1 GHz clock rate will have a 500 Ps low value pulse time duration. Control signal 136 can occur anytime during the low value pulse, subject to the response time of the multiplexer switch 106 control inputs 130 and 136. The ideal location within this 500 Ps window (for 1 GHz operation) is determined by the custom calibration process. This custom process removes any residual delay errors associated with the underlying ATE's calibration of the control signal's PEC source. What remains of the PEC error budget is the jitter, or uncertainty band, which will be well below the 200 Ps range, which will fit within the 500 Ps low time period for 1 GHz operation. If operation at higher speeds changes the waveforms significantly enough such that the condition stated above is invalid (condition: that the propagation delay through the high speed path does not vary with operating frequency) then the calibration routine for the high speed path cannot be identical to the slow speed path, but rather must be run at the target speed.

Figure 3:
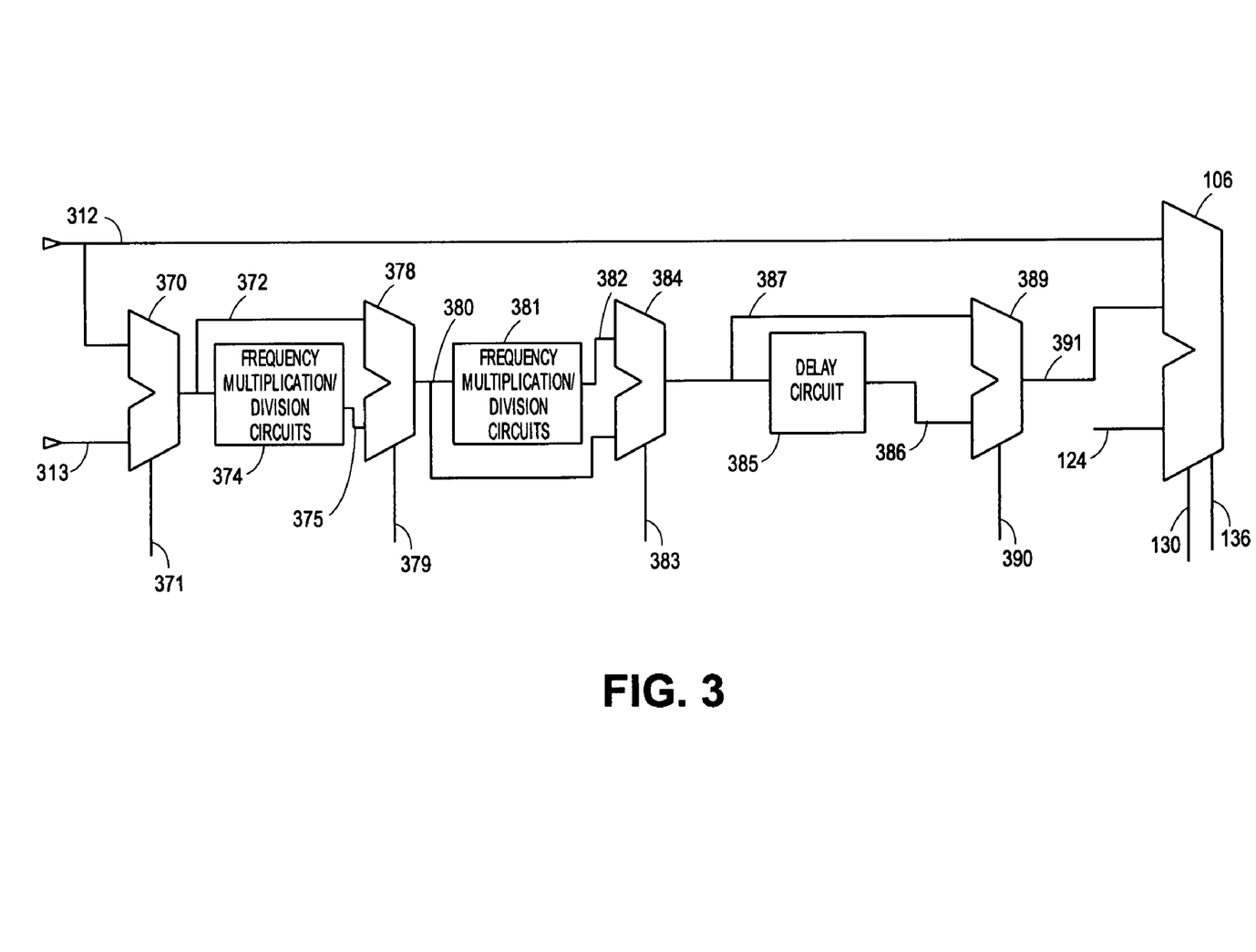
FIG. 3 portrays a circuit diagram of an embodiment of the system of the present invention.

Referring now to FIG. 3, a preferred embodiment of the present invention includes, rather than the signal path signal 112 and the signal path signal 113-signal 118, described with reference to FIG. 1 above, as input signals to the multiplexer switch 106, the system 300. The system 300 includes an input signal 412 that has the same characteristics as the input signal 112. Furthermore, the system 300 includes a signal 313 that has the same characteristics as the signal 113. The input signal 312 is passed straight through as an input to the multiplexer switch 106 portrayed with reference to FIG. 1, as a signal switched identically to the input signal 112 described with reference to FIGS. 1 and 2.

Each of the signals 312 and 313 are input to a multiplexer switch 370 that switches between the signals 312 and 313 according to a static selection control signal 371 so that the output signal 372 of the multiplexer 370 is alternatively a signal having the waveform of signal 312, or a signal having the waveform of signal 313. The output signal 372 is passed through a jitter correction and frequency multiplication/division circuits 374 implemented as a phased-lock loop circuit to provide as an output a signal 375 that has fast frequency and high edge sharpness pulses appropriate for transition fault testing. The preferred embodiment of the phase-locked loop is the MC 12439 presently available from the ON Semiconductor Corporation, having an adjustable multiplication factor. In contrast with the system portrayed with reference to FIG. 1, the system 300 presents to the jitter correction and frequency multiplication/division circuits 374 an alternative of the signals 312 and 313 because the multiplication factor necessary to transform the input to the circuits 374 may be appropriate for a signal 312 input, therefore eliminating a need for the signal 313 and saving the resource of the circuit to generate the signal 313. The system 300 permits a user to choose between the two different ways to generate the output signal 375, from one application of the system of the present invention to the next application.

Each of the signals 372 and 375 are input to a multiplexer switch 378 that switches between the signals 372 and 375 according to a static selection control signal 379 so that the output signal 380 of the multiplexer 378 is alternatively a signal having the waveform of signal 372, or a signal having the waveform of signal 375. The output signal 380 of the multiplexer 378 is passed through a frequency multiplication/division circuit 381 to provide as an output a signal 382 that has a changed frequency. The preferred embodiment of the multiplication/division circuit 381 is an MC12439 presently available from the ON Semiconductor Corporation implemented as a divide by eight circuit. Each of the signals 380 and 382 are input to a multiplexer switch 384 that switches between the signals 380 and 382 according to a static selection control signal 383 so that the output signal 386 of the multiplexer 384 is alternatively a signal having the waveform of signal 380 or a signal having the waveform of signal 382. The output signal 387 of the multiplexer 384 is passed through a delay circuit 385 to provide as an output a signal 386 that is aligned with the signal 312. The delay circuit 385 has the same characteristics as the alignment circuit described with reference to FIG. 1, but the delay circuit is tuned to compensate for the specific delay introduced by the circuitry in the system 300. The signal 382 is selected as the multiplexer 384 output for to have a convenient tap that bypasses the phase-locked loop circuit 374 during system test when signal 372 is used as the output of the multiplexer switch 378, and to have a second multiplication/division circuit to fine-tune the phase-locked loop when the output of the multiplexer switch is the signal 375.

Each of the signals 386 and 387 are input to a multiplexer switch 389 that switches between the signals 386 and 387 according to a static selection control signal 390 so that the output signal 391 of the multiplexer 389 is alternatively a signal having the waveform of signal 386 or a signal having the waveform of signal 387. The output signal 391 is input to the multiplexer switch 106 portrayed with reference to FIG. 1 as a signal switched identically to the input signal 118 described with reference to FIGS. 1 and 2. The signal 387 that is the output of the delay circuit 385 will be selected in normal operations and will be bypassed as an output of the multiplexer 389 only for test reasons. Each of the multiplexers 370, 378, 384, and 389 are preferably MC12439 multiplexer switches having ECL logic presently available from ON Semiconductor Corporation.

Figure 4:
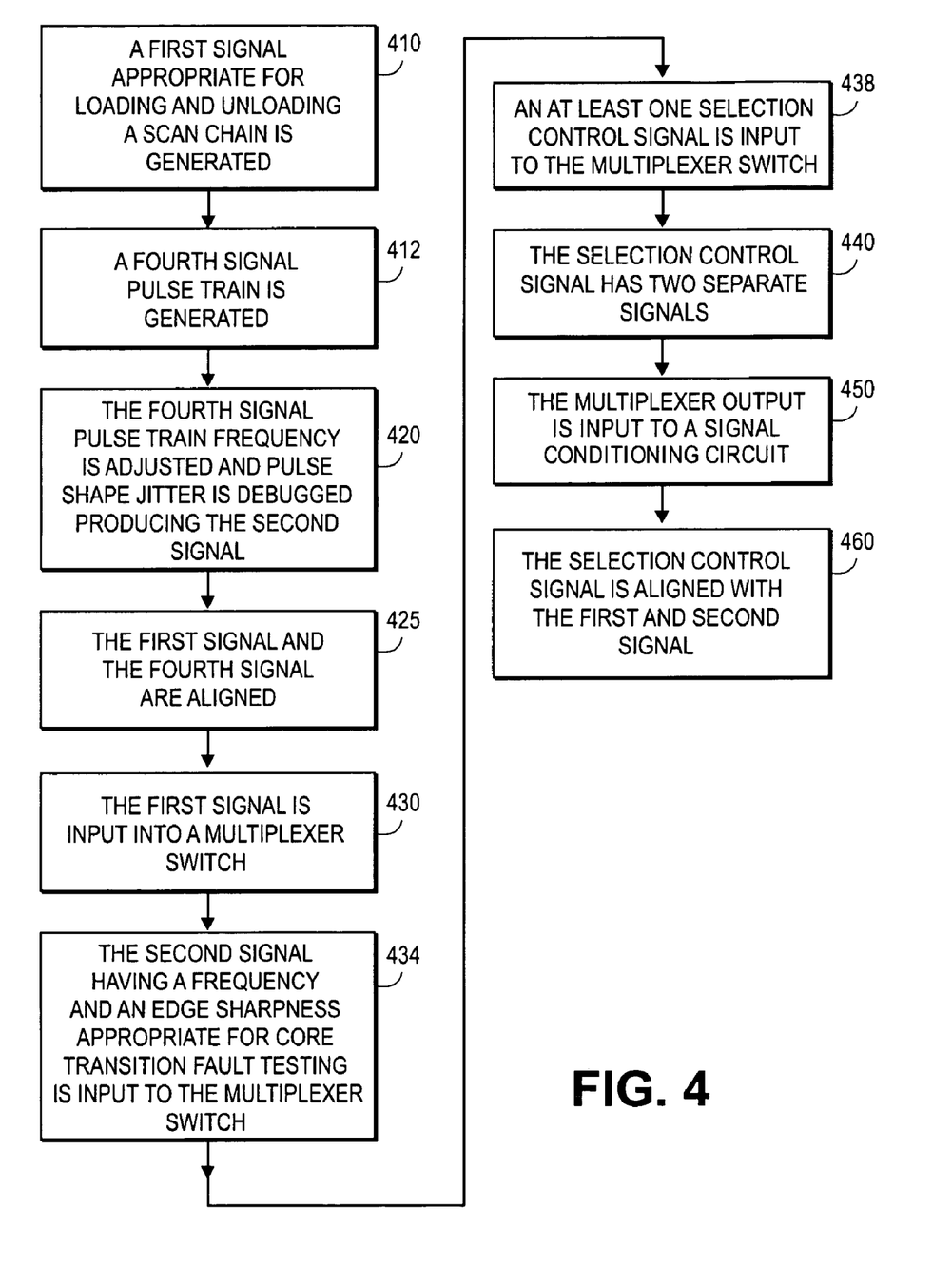
FIG. 4 portrays a flow chart of an embodiment of a method of the present invention.

Referring now to FIG. 4, a method of providing a pulse train having a sequence of variable frequency pulses includes in block 430, providing a first signal having a pulse train pattern into an input port of a multiplexer switch, the first signal characterized by a frequency appropriate for loading and unloading a scan chain; in block 434, providing a second signal having a pulse train into an input port of the multiplexer switch, the second signal characterized by a higher frequency than the first signal and an appropriate frequency and edge sharpness for exercising an integrated circuit during core transition fault testing; and in block 438, providing an at least one selection control signal to the multiplexer switch that the multiplexer switch depends upon to control the selection of alternatively the first signal and the second signal as the output signal of the multiplexer switch. The first signal is of a type referred to as signal 112 in FIG. 1, and having a waveform referred to as signal 212 in FIG. 2. The second signal is of a type referred to as signal 118 in FIG. 1, and having a waveform referred to as signal 218 in FIG. 2. The selection control signal is of a type in an embodiment having two separate signals, referred to as signals 130 and 136 in FIG. 1, and having the waveforms referred to as signals 230 and 236 in FIG. 2. The multiplexer is of a type referred to as the multiplexer switch 106 in FIG. 1.

The selection control signal(s) is in synchronization with the first and second signals, and the selection control signal(s) determines the output of the multiplexer. The waveform of the selection signal(s) are defined to switch the multiplexer output between the first and second signals so as to generate a multiplexer output appropriate to transition fault test a circuit under test with the second signal waveform portion, and to load and unload a scan chain with the first signal waveform portion, as has been discussed above. The selection control signal(s) waveform is such that the multiplexer output switches to the second signal from the first signal at a low value of both the first and the second signal and in enough time before the start of a second signal pulse, such that the multiplexer output maintains the edge sharpness of the second signal although the selection signal(s) may not have as high an edge sharpness as the second signal. The selection control signal(s) waveform is such that the multiplexer output switches to the first signal from the second signal at a low value of both the first and the second signal and in enough time before the start of a first signal pulse such that the multiplexer output maintains the edge sharpness of the first signal.

In the preferred embodiment, the method further includes a block 440 that is processed instead of block 438 in which the selection signal provided to the multiplexer has two separate signals referred to as signals 130 and 136 in FIG. 1, and having the waveforms referred to as signals 230 and 236 in FIG. 2; and there is a third signal provided to an input port of the multiplexer. The third signal has a static low waveform.

The waveform of the selection signal are defined to switch the multiplexer output between the first, second, and third signals so as to generate a multiplexer output appropriate to transition fault a circuit under test with the second signal waveform portion, and to load and unload a scan chain with the first signal waveform portion, as has been discussed above, and as is further discussed below.

The selection control signal waveform is such that the multiplexer output switches to the static low signal after the correct number of consecutive pulses having the signal two waveform have been output from the multiplexer, and then switches to the third signal during the low value portion of the second signal to correctly position the beginning of a first signal pulse rise when the multiplexer output switches to a low value portion of the first signal rather than switching directly from the second signal to the first signal; and also includes in the preferred embodiment and as is portrayed with reference to FIG. 2 the multiplexer output switching from the low value portion of a first signal to the third signal, and then to the low value portion of the second signal rather than switching directly form the first signal to the second signal.

The selection control signal waveform is such that the multiplexer output switches to the second signal from the first signal and then the third signal at a low value of both the first and the second signal and in enough time before the start of a second signal pulse such that the multiplexer output maintains the edge sharpness of the second signal, although the selection signal(s) may not have as high an edge sharpness as the second signal. The selection control signal(s) waveform is such that the multiplexer output switches to the first signal from the second signal and the third signal at a low value of both the first and the second signal and in enough time before the start of a first signal pulse such that the multiplexer output maintains the edge sharpness of the first signal.

In block 450, the multiplexer output is input to a signal conditioning circuit referred to as the signal conditioning circuit 148 in FIG. 1. The signal conditioning circuit translates the multiplexer voltage level to a circuit under test voltage level while substantially maintaining in its output the pulse edge accuracy of the input pulse train In block 410, the first signal is generated conventionally by a method that includes in the preferred embodiment of the present invention, a programmed output of an ATE PEC, appropriate for loading and unloading the scan chains of a circuit under test.

In block 412, a fourth signal pulse train is generated conventionally by a method that includes in the preferred embodiment of the present invention, a programmed output of an ATE PEC. The fourth signal is input into a frequency multiplication circuit to be presently disclosed, so that an output of the frequency multiplication circuit has a frequency identical to the signal 2, that is appropriate for a core transition fault test of a circuit under test. The pulse train frequency of the fourth signal is generated by a tradeoff with the design of the frequency multiplication circuit well known to those skilled in the art. The first signal and the fourth signal are synchronous so that they can be switched precisely by the multiplexer switch. It is preferred that the first signal and the fourth signal are generated by a common clock, as the most direct way for them to be synchronous In block 420, the fourth signal frequency is adjusted to the frequency of the second signal. Also in block 420, the fourth signal pulse shape jitter is debugged so that it has an increased edge sharpness appropriate as a signal input for a transition fault circuit of an integrated circuit at a clock rate of at least 100 MHz. The preferred embodiment for a circuit is a phased-lock loop as in the circuits 114 and 115 portrayed with reference to FIG. 1. The output of the circuits 114 and 115 is the second signal.

In block 425, the first signal, and the second signal are aligned to compensate for the delay introduced by the jitter debugging and the frequency adjusting circuit of the block 420. It is preferred that the aligning is by delaying the fourth signal/second signal in the manner portrayed with reference to the pulse alignment circuit 116 in FIG. 1.

In block 460, the selection control signal is aligned with the first and second signal. As with the first signal and the fourth signal, the selection control signal and the first and fourth signal are synchronous. It is preferred that the first signal, the fourth signal, and the selection control signal are each generated by a common clock, as the most direct way for them to be synchronous. It is preferred that the selection control signal and the first signal and the fourth signal be aligned by a calibration circuit as discussed with reference to the calibration circuit 158 described with reference to FIG. 1.

Although the method of the present invention has been described with specific reference to FIG. 4, the descriptions with reference to FIGS. 1, 2, and 3 provide a further disclosure of the method of the present invention; and although the system of the present invention has been described with specific reference to FIGS. 1, 2, and 3, the description with reference to FIG. 4 provides a further disclosure of the system of the present invention.

Although the present invention has been described with reference to specific exemplary embodiments, it is to be understood that these embodiments are merely illustrative of and not restrictive of the broad invention. The present invention is not limited to the specific constructions, arrangements, and steps shown and described, and that various modifications and changes may be made to these embodiments, and that alternative embodiments will become apparent, to those skilled in the art to which the present inventions pertains without departing from the broader scope of the present invention. Accordingly, the specification and drawings are to be regarded in an illustrative rather than a restrictive sense. Although a preferred embodiment of the invention has been illustrated and described, various alternatives, modifications and equivalents may be used. Therefore, the foregoing description should not be taken as limiting the scope of the present invention. The present invention is defined by the appended claims rather than the foregoing description.

I claim:

1. A system that includes
a first pulse train input to a switch having a repeating high value and low value at a first frequency, and a transition from the low value to the high value having a first edge sharpness;
a second pulse train input to the switch in synchronization with the first pulse train having a repeating high value and low value at a second frequency lower than the first frequency; and
a frequency changing circuit coupled between the input pulse train and the switch, the frequency changing circuit to one of multiply and divide the frequency of the second pulse train, wherein the output of the frequency changing circuit has substantially the frequency of the first pulse train,
the switch selecting an output from one of the first pulse train and the second pulse train to create an output pulse train appropriate to transition fault test an integrated circuit, depending upon a selection signal having a determined pulse train input to the switch;
the selection signal in synchronization with the first pulse train;
wherein the switch switches from the second pulse train to the first pulse train and substantially maintains the first edge sharpness of the first pulse train, and from the first pulse train to the second pulse train, during a low value of both the first and the second pulse trains.

2. The system as defined in claim 1 further including
a signal input to the switch having the substantially low value;
the switch selecting an output from one of the first pulse train input, the second pulse train input, and the third input, depending upon the selection signal;
wherein the switch switches from the second pulse train to the first pulse train by switching from the second pulse train to the signal to the first pulse train.

3. The system as defined in claim 1 further including
a signal input to the switch having substantially the low value;
the switch selecting an output from one of the first pulse train input, the second pulse train input, and the third input, depending upon the selection signal;

wherein the switch switches from the first pulse train to the second pulse train by switching from the first pulse train to the signal to the second pulse train.

4. The system as defined in claim 1 wherein the selection signal consists of one of:
   a third pulse train; and
   a fourth pulse train.

5. The system as defined in claim 1 further including
   an edge placement accuracy improvement circuit to improve the edge placement accuracy of an input pulse train;
   wherein the output of the edge placement accuracy improvement circuit has substantially the edge placement accuracy of the first pulse train, and the edge placement accuracy improvement circuit is coupled between the input pulse train and the switch; and
   the input pulse train.

6. The system as defined in claim 5 further including a pulse train alignment circuit to align the first pulse train with the second pulse train, wherein the pulse train alignment circuit is coupled to at least one of the input pulse train-first pulse train path and the second pulse train path.

7. The system as defined in claim 1 further including a pulse train alignment circuit coupled to at least one of the input pulse train-first pulse train path and the second pulse train path to align the first pulse train with the second pulse train.

8. The system as defined in claim 1 further including a pulse train alignment circuit coupled to at least one of the input pulse train-first pulse train path and the second pulse train path to align the first pulse train with the second pulse train.

9. The system as defined in claim 1 further including
   a pulse train alignment circuit to align the selection signal with at least one of the second pulse train and the first pulse train.

10. The system as defined in claim 1 further including
    a signal conditioning circuit to translate the voltage level of an output of the switch; and
    the output of the switch.

11. A system that includes:
    a first pulse train at a frequency adequate to load and unload at least one scan chain of an integrated circuit input to a switch;
    a second pulse train in synchronization with the first pulse train having a frequency and pulse edge sharpness adequate to test the propagation time of an integrated circuit core at functional at-frequency rates input to the switch;
    the switch that dynamically outputs alternatively a portion of the first pulse train or the second pulse train as an output, based on an input from an at least one selection signal;
    the selection signal defined for the switch to output a signal to the switch to load and unload the scan chains and to transition fault test the integrated circuit core; and
    an input pulse train and at least one of:
      a smoothing circuit to improve the edge placement accuracy of the input pulse train, wherein the output of the smoothing circuit has the edge placement accuracy of the second pulse train, and the smoothing circuit is coupled between the input pulse train and the switch; and
      a frequency changing circuit to one of multiply and divide the frequency of the input pulse train, wherein the output of the frequency changing circuit is the first pulse train, and the frequency changing circuit is coupled between the input pulse train and the switch.

12. The system as defined in claim 11 further including:
    a signal having a substantially low value input to the switch wherein the switch outputs alternatively the first pulse train portion or the second pulse train portion or the signal as an output, based on an input from the selection signal;
    the switch switches the output from the second pulse train to the first pulse train by switching from the second pulse train to the signal to the first pulse train; and
    the switch switches the output from the first pulse to the second pulse train by switching from the first pulse train to the signal to the second pulse train.

13. The system as defined in claim 11 further including
    an alignment circuit coupled to at least one of the input pulse train-second pulse train path and the first pulse train path to align the first pulse train with the second pulse train.

14. The system as defined in claim 11 further including
    a calibration circuit to align the selection signal with at least one of the first and second signal.

15. The system as defined in claim 11 wherein the selection signal is in synchronization with at least one of the first signal and the second signal.

16. A system, comprising:
    a first pulse train input to a switch having a repeating high value and low value at a first frequency, and a transition from the low value to the high value having a first edge sharpness;
    a second pulse train input to the switch in synchronization with the first pulse train having a repeating high value and low value at a second frequency lower than the first frequency; and
    a circuit is coupled between the input pulse train and the switch, the circuit having an edge placement accuracy improvement circuit and frequency changing circuit to both improve the edge placement accuracy of an input pulse train and one of multiply and divide the frequency of an input pulse train, wherein the output of the circuit has the edge placement accuracy and the frequency of the first pulse train,
    the switch selecting an output from one of the first pulse train and the second pulse train to create an output pulse train appropriate to transition fault test an integrated circuit, depending upon a selection signal having a determined pulse train input to the switch;
    the selection signal in synchronization with the first pulse train;
    wherein the switch switches from the second pulse train to the first pulse train and substantially maintains the first edge sharpness of the first pulse train, and from the first pulse train to the second pulse train, during a low value of both the first and the second control signal.

17. The system as defined in claim 16 further including a pulse train alignment circuit coupled to at least one of the input pulse train-first pulse train path and the second pulse train path to align the first pulse train with the second pulse train.

18. The system as defined in claim 16 further including
    a signal input to the switch having the substantially low value;
    the switch selecting an output from one of the first pulse train input, the second pulse train input, and the third input, depending upon the selection signal;
    wherein the switch switches from the second pulse train to the first pulse train by switching from the second pulse train to the signal to the first pulse train.

* * * * *